US012787156B2

(12) United States Patent
Takakura et al.

(10) Patent No.: US 12,787,156 B2
(45) Date of Patent: Nov. 3, 2026

(54) CIRCUIT MODULE

(71) Applicant: Murata Manufacturing Co., Ltd., Kyoto (JP)

(72) Inventors: Tsuyoshi Takakura, Kyoto (JP); Masaaki Mizushiro, Kyoto (JP); Satoshi Izumi, Kyoto (JP); Ryuichiro Wada, Kyoto (JP); Hiroki Yoshimori, Kyoto (JP); Yoshihito Otsubo, Kyoto (JP); Tadashi Nomura, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 245 days.

(21) Appl. No.: 18/650,918

(22) Filed: Apr. 30, 2024

(65) Prior Publication Data

US 2024/0284591 A1 Aug. 22, 2024

Related U.S. Application Data

(63) Continuation of application No. PCT/JP2022/036909, filed on Oct. 3, 2022.

(30) Foreign Application Priority Data

Nov. 1, 2021 (JP) ................................ 2021-178932

(51) Int. Cl.
*H05K 1/02* (2006.01)

(52) U.S. Cl.
CPC ... *H05K 1/0271* (2013.01); *H05K 2201/0317* (2013.01); *H05K 2201/0338* (2013.01); (Continued)

(58) Field of Classification Search
None
See application file for complete search history.

(56) References Cited

U.S. PATENT DOCUMENTS

2006/0170086 A1 8/2006 Song et al.
2010/0225202 A1 9/2010 Fukano et al.
(Continued)

FOREIGN PATENT DOCUMENTS

JP 2006-210888 A 8/2006
JP 2014-064329 A 4/2014
(Continued)

OTHER PUBLICATIONS

International Search Report for PCT/JP2022/036909 dated Nov. 8, 2022.

*Primary Examiner* — Sherman Ng
(74) *Attorney, Agent, or Firm* — McDonald Hopkins LLC

(57) ABSTRACT

A circuit module includes: a substrate including a first main surface and a second main surface; a resin layer on the first main surface of the substrate; an electronic component; a penetrating portion penetrating the resin layer in a thickness direction; a first conductor that is a pillar conductor present in the penetrating portion, the first conductor including a first bottom closer to the substrate and a second bottom inward of an outer surface of the resin layer; a second conductor that is a metal film covering at least a portion of a side surface of the first conductor, the second conductor including a portion extending continuously from the side surface of the first conductor to the same plane with the outer surface of the resin layer.

18 Claims, 6 Drawing Sheets

(52) U.S. Cl.
CPC ................ *H05K 2201/0367* (2013.01); *H05K 2201/0391* (2013.01)

(56) References Cited

U.S. PATENT DOCUMENTS

| | | | | |
|---|---|---|---|---|
| 2015/0092356 | A1 | 4/2015 | Yoshikawa et al. | |
| 2015/0098204 | A1 | 4/2015 | Yoshikawa et al. | |
| 2016/0073499 | A1* | 3/2016 | Ogawa | H05K 1/111 361/736 |
| 2019/0333849 | A1 | 10/2019 | Furuichi | |
| 2020/0008301 | A1* | 1/2020 | Kusuyama | H05K 1/11 |

FOREIGN PATENT DOCUMENTS

| | | | |
|---|---|---|---|
| JP | 2015-072984 | A | 4/2015 |
| JP | 2015-076465 | A | 4/2015 |
| JP | 2019-192885 | A | 10/2019 |
| WO | 2014/188760 | A1 | 11/2014 |
| WO | 2018/168709 | A1 | 9/2018 |

* cited by examiner

CIRCUIT MODULE

CROSS REFERENCE TO RELATED APPLICATION

This is a continuation of International Application No. PCT/JP2022/036909 filed on Oct. 3, 2022 which claims priority from Japanese Patent Application No. 2021-178932 filed on Nov. 1, 2021. The contents of these applications are incorporated herein by reference in their entireties.

BACKGROUND OF THE DISCLOSURE

Field of the Disclosure

The present disclosure relates to a circuit module.

Description of the Related Art

Patent Literature 1 discloses a circuit module including: a substrate provided with a first electrode and a second electrode on one main surface thereof; a first electronic component; and a first resin layer. The first resin layer is on the one main surface of the substrate. The first electronic component is connected to the first electrode and disposed on the first resin layer such that at least a portion of a surface opposite to a surface adjacent to the first electrode is exposed. The second electrode is disposed on the first resin layer such that an end of the second electrode is located outward of an outer surface of the first resin layer. The first electrode includes a first electrode base and a first plating film covering at least a portion of the outer surface of the first electrode base. The second electrode includes: a second electrode base; a metal pillar made of sintered metal powder and including a first end directly connected to the second electrode base and a second end located inward of the outer surface of the first resin layer; a cylindrical second plating film covering at least a portion of a side surface of a connector between the second electrode base and the metal pillar and including an end on the same plane with the second end of the metal pillar; and a cover including a first main surface connected between the second end of the metal pillar and the end of the second plating film and a second main surface located outward of the outer surface of the first resin layer.

Patent Literature 1: WO 2018/168709

BRIEF SUMMARY OF THE DISCLOSURE

In the circuit module according to Patent Literature 1, an end of the second electrode which corresponds to a connecting conductor is located outward of the outer surface of the resin layer. Thus, when applying solder to the connecting conductor for mounting on another substrate or the like, an interface between the solder and the connecting conductor is located outward of the outer surface of the resin layer. When the interface between the solder and the connecting conductor is located outward of the outer surface of the resin layer, a large stress is applied to the interface upon impact such as drop. Meanwhile, an intermetallic compound formed as a result of mutual diffusion of a conductive material of the connecting conductor and the solder is present on the interface between the connecting conductor and the solder. This intermetallic compound is generally brittle. Thus, when the stress is applied due to impact such as drop, the interface between the connecting conductor and the solder may crack or break, possibly making the connection less reliable.

The present disclosure was made to solve the above issue and aims to provide a circuit module having excellent impact resistance.

The present disclosure provides a circuit module including: a substrate including a first main surface and a second main surface; a resin layer on the first main surface of the substrate; an electronic component on the first main surface or the second main surface of the substrate; a penetrating portion penetrating the resin layer in a thickness direction; a first conductor that is a pillar conductor present in the penetrating portion, the first conductor including a first bottom closer to the substrate and a second bottom inward of an outer surface of the resin layer; a second conductor that is a metal film covering at least a portion of a side surface of the first conductor, the second conductor including a portion extending continuously from the side surface of the first conductor to the same plane with the outer surface of the resin layer; and a solder bump covering an opening of the penetrating portion adjacent to the outer surface of the resin layer, the solder bump including a portion present in the penetrating portion and electrically connected to the second bottom of the first conductor in the penetrating portion.

The present disclosure can provide a circuit module having excellent impact resistance.

DETAILED DESCRIPTION OF THE DISCLOSURE

Hereinafter, the circuit module of the present disclosure is described.

The present disclosure is not limited to the following preferred embodiments, and may be suitably modified without departing from the gist of the present disclosure. Combinations of two or more preferred features described in the following preferred embodiments are also within the scope of the present disclosure.

In a circuit module of the present disclosure, a solder bump includes a portion present in a penetrating portion, and the solder bump is electrically connected to a second bottom of a first conductor in the penetrating portion. Thus, an intermetallic compound, which is an alloy of a conductor and the solder bump, is formed in the penetrating portion. The intermetallic compound is brittle compared to the conductor and the solder bump. The intermetallic compound formed in the penetrating portion is located inward of an outer surface of a resin layer. Here, a side surface of the intermetallic compound is covered with a second conductor and the resin layer. This alleviates the stress applied to the intermetallic compound upon impact such as drop. As a result, cracking or breakage of the intermetallic compound can be prevented or reduced, which improves the impact resistance of the circuit module.

First, a description is given on the circuit module in which the second bottom of the first conductor is in direct contact with the solder bump.

This circuit module is referred to as "the circuit module of the first embodiment".

Figure 1:
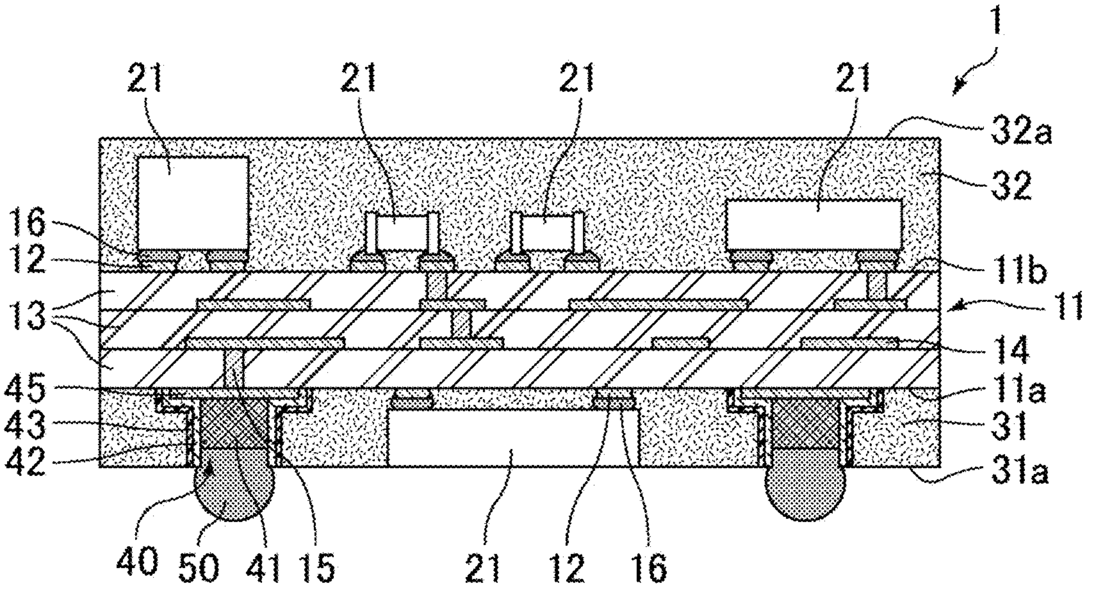
FIG. 1 is a schematic cross-sectional view of an example circuit module according to a first embodiment.

FIG. 1 is a schematic cross-sectional view of an example circuit module according to the first embodiment.

A circuit module 1 includes a substrate 11, electronic components 21, a resin layer 31, and a resin layer 32.

The substrate 11 includes a first main surface 11*a* and a second main surface 11*b* opposite to each other. Electrodes 12 are on the first main surface 11*a* and the second main surface 11*b* of the substrate 11. The substrate 11 includes insulation layers 13 and essential conductors of the electronic circuit configuration, i.e., pattern conductors 14 and via conductors 15.

The substrate 11 is a ceramic substrate in which the insulation layers 13 are made of, for example, a low-temperature sintered ceramic material. The low-temperature sintered ceramic material is a type of ceramic material. It is a material that can be sintered simultaneously with silver and copper used as metal materials at a sintering temperature of 1000° C. or lower. Examples include those containing $SiO_2$—CaO—$Al_2O_3$—$B_2O_3$-based glass ceramic or $SiO_2$—MgO—$Al_2O_3$—$B_2O_3$-based glass ceramic. Yet, the type of the insulation layers 13 is not limited thereto. For example, the insulation layers 13 may be made of a glass epoxy resin, a ceramic material other than low-temperature sintered ceramic materials, glass, or the like. The pattern conductors 14 and the via conductors 15 are formed from a metal material selected from, for example, Cu, a Cu alloy, and the like. Yet, the material of the pattern conductors 14 and the via conductors 15 is not limited thereto. The substrate 11 may be either a multilayer substrate or a single layer substrate.

The electrodes 12 are formed, for example, by plating a surface of a metal material selected from Cu, a Cu alloy, and the like with a metal material selected from Ni, a Ni alloy, and the like.

Each electronic component 21 is connected via connecting members 16 to the electrodes 12 on the first main surface 11*a* of the substrate 11 or the second main surface 11*b* of the substrate 11.

Preferably, the electronic components 21 are, for example, chip components such as multilayer capacitors, multilayer inductors, and various filters, and semiconductor products such as various ICs and memories. The connecting members 16 are, for example, Sn—Ag—Cu-based Pb-free solder. Yet, the material of the connecting members 16 is not limited thereto.

In FIG. 1, the electronic components 21 are on both the first main surface 11*a* of the substrate 11 and the second main surface 11*b* of the substrate 11, but it suffices as long as one or more electronic components 21 are on at least one of the first main surface 11*a* of the substrate 11 or the second main surface 11*b* of the substrate 11.

The resin layer 31 is on the first main surface 11*a* of the substrate 11. The resin layer 32 is on the second main surface 11*b* of the substrate 11. Preferably, the resin layer 31 and the resin layer 32 are each made of a resin composition in which a filler such as a glass material or silica is dispersed in a resin material. The resin layers may be layers made of only a resin material. The resin layer 31 and the resin layer 32 may be made of the same resin material or different resin materials. The circuit module of the present disclosure may not include a resin layer on the second main surface.

Each electronic component 21 may be completely covered with the resin layer 31 or the resin layer 32, or a surface of the electronic component 21 may be exposed from an outer surface 31*a* of the resin layer 31 or an outer surface 32*a* of the resin layer 32. The term "outer surface of the resin layer" as used herein refers to one not in contact with the substrate 11, which is one of two main surfaces opposite to each other in a thickness direction of the resin layer.

Figure 2:
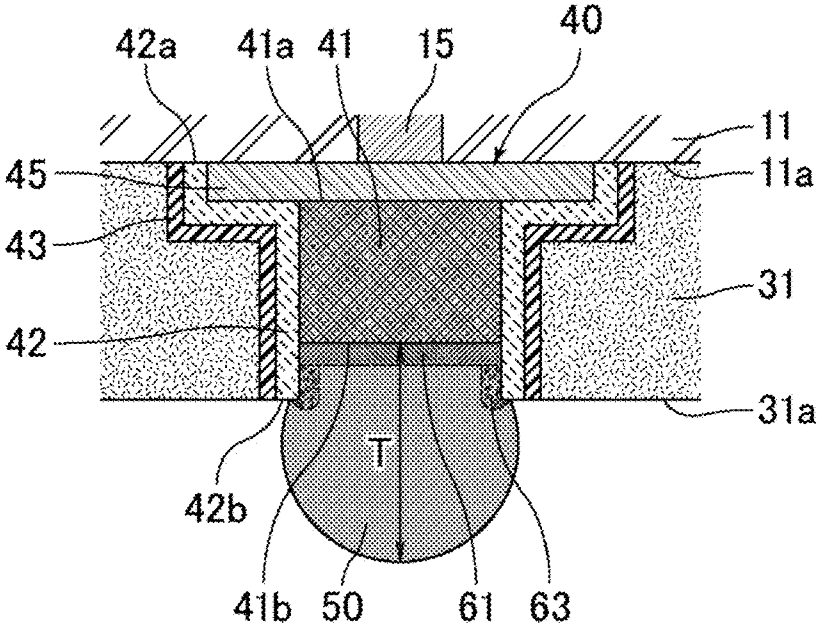
FIG. 2 is a schematic cross-sectional view of an example peripheral structure of a penetrating portion of the circuit module according to the first embodiment.

FIG. 2 is a schematic cross-sectional view of an example peripheral structure of a penetrating portion of the circuit module according to the first embodiment.

A penetrating portion 40 penetrates the resin layer 31 in the thickness direction. The penetrating portion 40 may have any shape. A first conductor 41, an electrode base 45, a second conductor 42, and a third conductor 43 are present in the penetrating portion 40. A portion of a solder bump 50 is also present therein.

The first conductor 41 is a pillar conductor present in the penetrating portion 40. One end of the first conductor 41 is directly connected to the electrode base 45. Here, that "one end of the first conductor 41 is directly connected to the electrode base 45" means that one end is integrally connected, for example, by sintering, without using a connecting member such as solder. In other words, the first conductor 41 is made of sintered metal powder.

The first conductor 41 is a pillar conductor and includes a first bottom 41*a* and a second bottom 41*b* opposite to each other.

The first bottom 41*a* of the first conductor 41 is closer to the substrate 11 than the second bottom 41*b* of the first conductor 41 is. The first bottom 41*a* of the first conductor 41 is in contact with the electrode base 45.

The second bottom 41*b* of the first conductor 41 is located inward of the outer surface 31*a* of the resin layer 31.

The second bottom 41*b* of the first conductor 41 is in direct contact with the solder bump 50, and the first conductor 41 is electrically connected to the solder bump 50.

The first conductor 41 may have any shape, such as a cylindrical or prismatic shape.

One of main surfaces of the electrode base 45 is in contact with the first main surface 11*a* of the substrate 11. The other main surface of the electrode base 45 is in contact with the first bottom 41*a* of the first conductor 41. The circuit module may not include the electrode base in the penetrating portion. The first conductor may be in direct contact with the substrate without the electrode base therebetween.

The second conductor 42 is a metal film covering at least a portion of a side surface of the first conductor 41.

A portion of the second conductor 42 extends continuously from the side surface of the first conductor 41 to the same plane with the outer surface 31*a* of the resin layer 31.

The second conductor 42 includes a first end 42*a* and a second end 42*b*. The first end 42*a* of the second conductor 42 is closer to the substrate 11 than the second end 42*b* of the second conductor 42 is.

The first end 42*a* of the second conductor 42 may be in contact with the substrate 11.

The second end 42*b* of the second conductor 42 may be located on the same plane with the outer surface 31*a* of the resin layer 31. The second end 42*b* of the second conductor 42 may be located outward of the outer surface 31*a* of the resin layer 31.

In FIG. 2, the second conductor 42 covers the entire side surface of the first conductor 41, but the second conductor 42 may cover only a portion of the side surface of the first conductor 41.

In FIG. 2, the second conductor covers the side surface of the electrode base 45, but the second conductor 42 may not cover the side surface of the electrode base 45.

The solder bump 50 covers an opening of the penetrating portion 40. A portion of the solder bump 50 is present in the penetrating portion 40. The second bottom 41*b* of the first conductor 41 is in direct contact with the solder bump 50 in the penetrating portion 40, and the first conductor 41 is electrically connected to the solder bump 50.

In the circuit module 1, the solder bump 50 is in direct contact with the second bottom 41*b* of the first conductor 41. A boundary surface between the solder bump 50 and the second bottom 41*b* of the first conductor 41 is located inward of the outer surface 31*a* of the resin layer 31. A first intermetallic compound 61 is formed on the boundary surface between the solder bump 50 and the second bottom 41*b* of the first conductor 41 as a result of mutual diffusion of a metal material of the solder bump 50 and a metal material of the first conductor 41. The first intermetallic compound 61 is located inward of the outer surface 31*a* of the resin layer 31. A side surface of the first intermetallic compound 61 is covered with the second conductor 42.

The solder bump 50 is in contact with the second conductor 42 in the penetrating portion 40. A third intermetallic compound 63 is present on a boundary surface between the solder bump 50 and the second conductor 42.

The following effects are produced in cases where a portion of the solder bump 50 is present in the penetrating portion 40 and the first intermetallic compound 61 is present in the penetrating portion 40.

The first intermetallic compound 61 is formed on a boundary surface between the first conductor 41 and the solder bump 50. The first intermetallic compound 61 is brittle compared to the first conductor 41 and the solder bump 50. The first intermetallic compound 61 formed in the penetrating portion 40 is located inward of the outer surface 31*a* of the resin layer 31. Here, the side surface of the first intermetallic compound 61 is covered with the second conductor 42 and the resin layer 31. This alleviates the stress applied to the first intermetallic compound 61 upon impact such as drop. As a result, cracking or breakage of the first intermetallic compound 61 can be prevented or reduced, which improves the impact resistance of the circuit module.

In the circuit module 1 according to the first embodiment, the solder bump 50 is partially present in the penetrating portion 40, which superficially increases the height (the height indicated by a double-headed arrow T in FIG. 2) of the solder bump 50. When the height of the solder bump 50 increases, the stress applied to the solder bump 50 due to temperature cycling is dispersed. This improves the temperature cycling resistance of the circuit module.

The term "height of the solder bump" as used herein refers to the height of a portion including the solder bump and an intermetallic compound formed on the surface of the solder bump.

Preferably, the second conductor 42 is made of a metal material harder than the first conductor 41. When the second conductor 42 is made of a metal material harder than the first conductor 41, the stress applied to the first intermetallic compound 61 is further alleviated, which further improves the impact resistance of the circuit module.

The hardness of the metal material herein means the Vickers hardness.

Preferably, the circuit module 1 includes the third conductor 43 that is a metal film covering at least a portion of a side surface of the second conductor 42. The presence of the third conductor 43 further alleviates the stress applied to the first intermetallic compound 61, which improves the impact resistance of the circuit module.

Preferably, the third conductor 43 is made of a metal material having a higher ductility than the first intermetallic compound 61 formed on the boundary surface between the first conductor 41 and the solder bump 50. When the third conductor 43 is made of a metal material having a higher ductility than the first intermetallic compound 61 formed on the boundary surface between the first conductor 41 and the solder bump 50, the stress applied to the first intermetallic compound 61 is further alleviated, which further improves the impact resistance of the circuit module.

Preferably, the metal material of the third conductor 43 has a higher ductility than the metal material of the second conductor 42, and the metal material of the second conductor 42 has a higher ductility than the metal material of the first conductor 41. When the first conductor 41, the second conductor 42, and the third conductor 43 satisfy the above relationship, the stress applied to the first intermetallic compound 61 is further alleviated, which further improves the impact resistance of the circuit module.

The material of the first conductor 41 may be a metal material selected from, for example, Cu, a Cu alloy, and the like. The Cu alloy may be, for example, a Cu-10Ni alloy (weight ratio of Cu/Ni: 90/10).

The material of the second conductor 42 may be a metal material selected from, for example, metals such as Ni, Ti, W, and Co and alloys thereof.

The material of the third conductor 43 may be a metal material selected from, for example, Au, an Au alloy, and the like.

The material of the electrode base 45 may be a metal material selected from, for example, Cu, a Cu alloy, and the like. The Cu alloy may be, for example, a Cu-10Ni alloy.

The first conductor 41 and the electrode base 45 may be made of the same metal material. The electrodes 12 and the electrode base 45 may be made of the same metal material.

When the material of the first conductor 41 is Cu or a Cu alloy, the Cu and the solder form an alloy, resulting in the first intermetallic compound 61, which is a high melting point alloy phase having a high melting point.

When the material of the second conductor 42 is Ni, the Ni and the solder form an alloy, resulting in the third intermetallic compound 63, which is a high melting point alloy phase having a high melting point.

Preferably, the first conductor 41 is depressed from the outer surface 31*a* of the resin layer 31 by 1.5 μm or more.

When the first bottom 41*a* and the second bottom 41*b* of the first conductor 41 are circular or substantially circular, preferably, the radius of each of them is 100 μm or more and 300 μm or less.

Preferably, the thickness of the second conductor 42 is 1 μm or more.

Preferably, the thickness of the third conductor 43 is 0.03 μm or more.

Preferably, the height (the height indicated by the double-headed arrow T in FIG. 2) of the solder bump 50 is 2.5 μm or more.

Preferably, the height of a portion, which is not inside the penetrating portion 40, of the solder bump 50 is 1 μm or more.

Preferably, the thickness of the first intermetallic compound 61 is 0.5 μm or more.

Preferably, the first intermetallic compound 61 is located inward of the outer surface 31*a* of the resin layer 31 by 1 μm or more.

Preferably, the thickness of the resin layer 31 on the first main surface 11*a* of the substrate 11 is 30 μm or more and 200 μm or less.

Next, a method of producing the circuit module according to the first embodiment is described.

FIGS. 3A, 3B, 3C, 3D, 3E, and 3F are each a schematic cross-sectional view of an example method of producing the penetrating portion of the circuit module according to the first embodiment.

In the method of producing the circuit module 1 according to the first embodiment, the steps not related to the penetrating portions 40 may be similar to those described in Patent Literature 1. Thus, steps different from the steps shown in Patent Literature 1 are mainly described hereinafter.

Figure 3A:
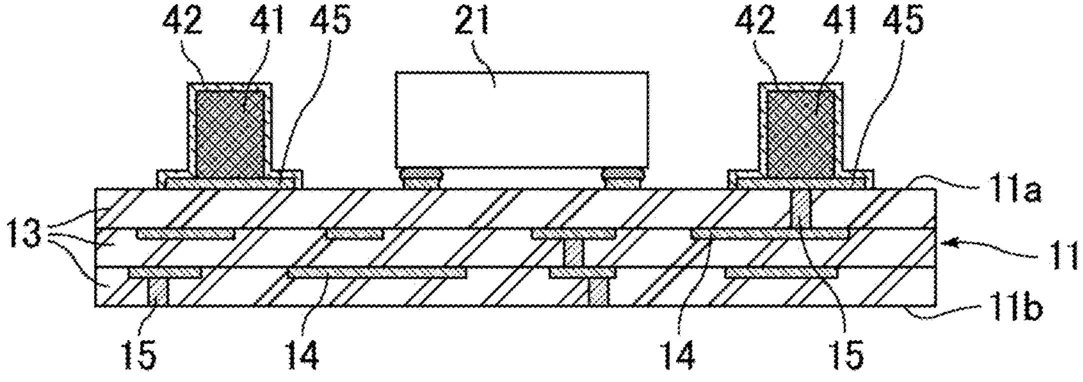
FIG. 3A is a schematic cross-sectional view of an example method of producing the penetrating portion of the circuit module according to the first embodiment.

First, as shown in FIG. 3A, a component mounting board is provided which includes: the substrate 11; the electronic component 21 on the first main surface 11*a* of the substrate 11; the electrode bases 45 on the first main surface 11*a* of the substrate 11; the first conductors 41 in contact with the electrode bases 45; and the second conductors 42 covering the first conductors 41 and the electrode bases 45 excluding portions where the electrode bases 45 are in contact with the substrate 11. The component mounting board can be prepared by the same method up to the point where the component mounting board is in the state shown in FIG. 6B of Patent Literature 1.

Figure 3B:
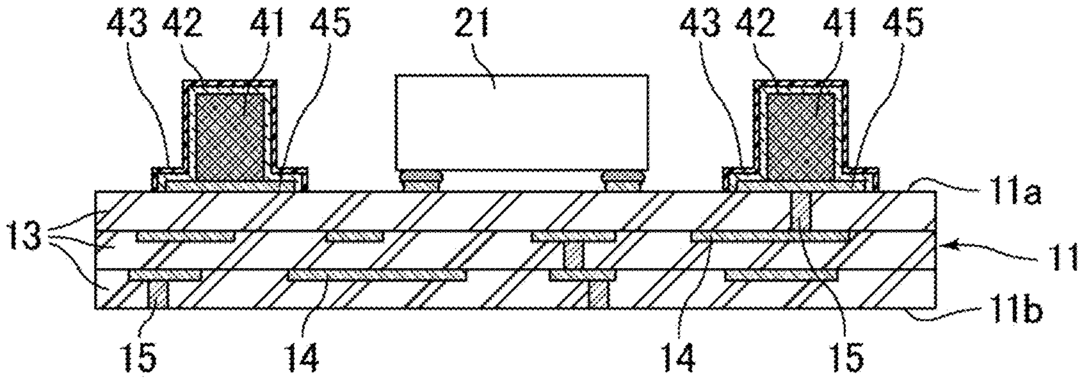
FIG. 3B is a schematic cross-sectional view of an example method of producing the penetrating portion of the circuit module according to the first embodiment.

Next, as shown in FIG. 3B, the third conductors 43 covering the outer surfaces of the second conductors 42 are formed. The third conductors 43 can be formed by a known electroless plating method. This step is not performed when the circuit module 1 does not include the third conductors 43.

Figure 3C:
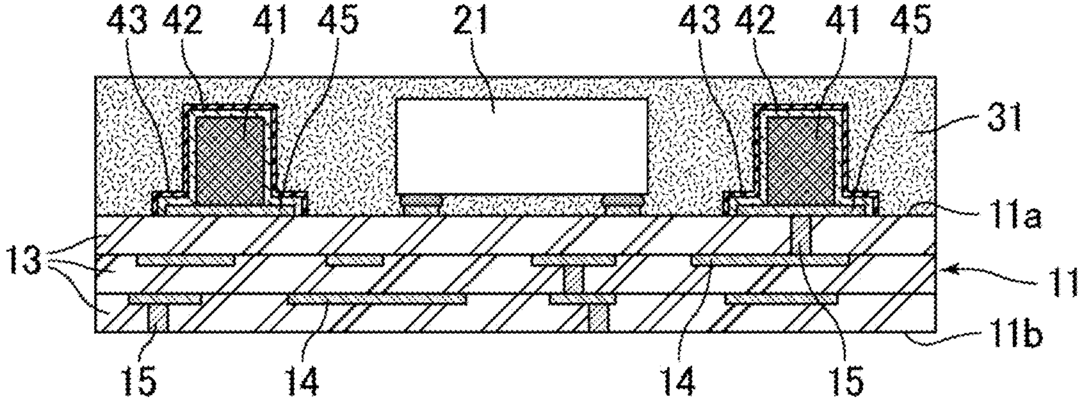
FIG. 3C is a schematic cross-sectional view of an example method of producing the penetrating portion of the circuit module according to the first embodiment.

Next, as shown in FIG. 3C, the resin layer 31 is formed on the first main surface 11*a* of the substrate 11 to cover the entirety of the electronic component 21, the first conductors 41, the second conductors 42, and the third conductors 43. The resin layer 31 can be formed on the first main surface 11*a* of the substrate 11 by a known technique such as applying a resin material for forming the resin layer 31 to the first main surface 11*a* of the substrate 11.

Figure 3D:
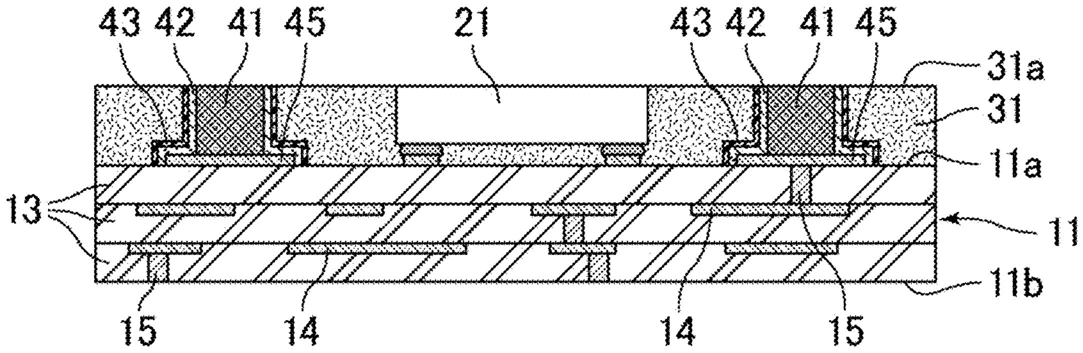
FIG. 3D is a schematic cross-sectional view of an example method of producing the penetrating portion of the circuit module according to the first embodiment.

Next, as shown in FIG. 3D, polishing is performed on the electronic component 21, the first conductors 41, the second conductors 42, the third conductors 43, and the resin layer 31 such that their surfaces opposite to the surfaces in contact with the substrate 11 of the resin layer 31 are polished. Here, polishing is performed until a polished surface of each first conductor 41 is exposed. As a result, the outer surface 31*a* of the resin layer 31, which is a polished surface of the resin layer 31 parallel to the first main surface 11*a* of the substrate 11, a polished surface of the electronic component 21, a polished surface of each first conductor 41, a polished surface of each second conductor 42, and a polished surface of each third conductor 43 are flush with one another. Polishing can be performed by a known technique such as lapping.

Figure 3E:
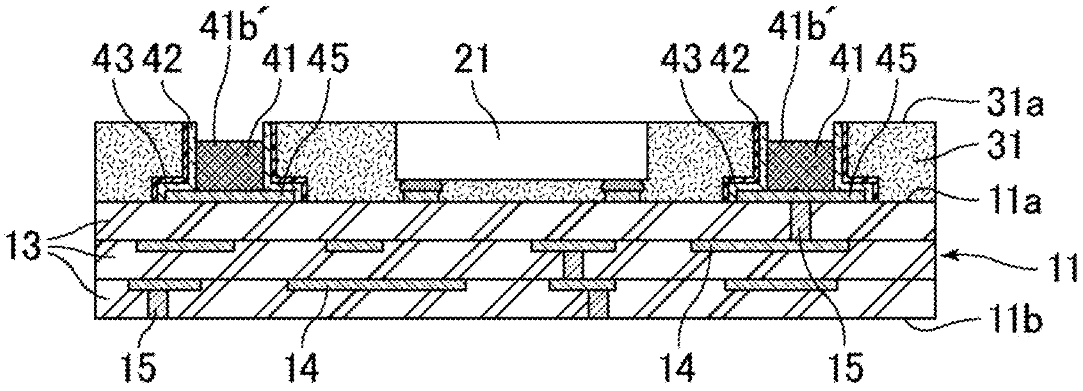
FIG. 3E is a schematic cross-sectional view of an example method of producing the penetrating portion of the circuit module according to the first embodiment.

Next, as shown in FIG. 3E, the polished surface of each first conductor 41 is etched such that an exposed surface 41*b*' of each first conductor 41 is located inward of the outer surface 31*a* of the resin layer 31. Here, the second conductors 42 and the third conductors 43 are not etched. Thus, the exposed surface 41*b*' of each first conductor 41 is shifted inward of the outer surface 31*a* of the resin layer 31 by a distance corresponding to the etched region. Meanwhile, the polished surfaces of the second conductors 42 and the third conductors 43 are still flush with the outer surface 31*a* of the resin layer 31.

The etching may be performed using an etchant by which the material (typically Cu) of the first conductors 41 is etched but the material (typically Ni) of the second conductors 42 and the material (typically Au) of the third conductors 43 are not etched.

Figure 3F:
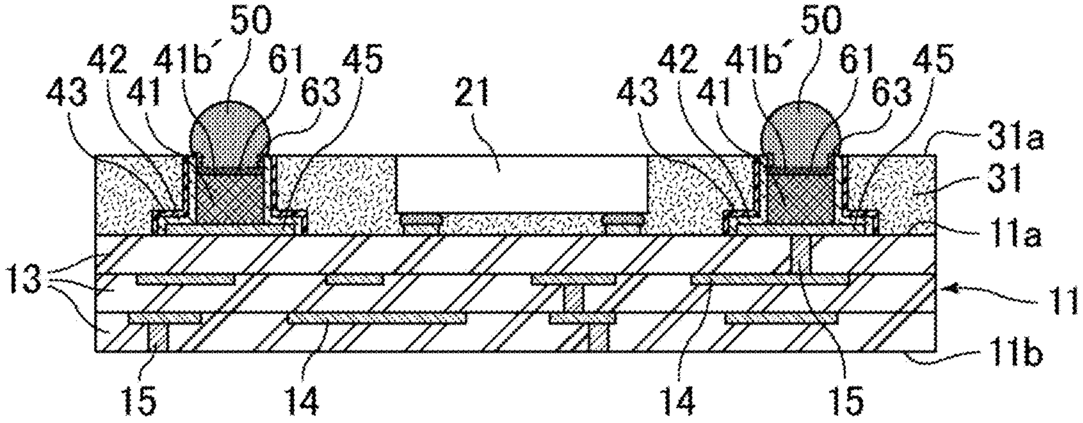
FIG. 3F is a schematic cross-sectional view of an example method of producing the penetrating portion of the circuit module according to the first embodiment.

Next, as shown in FIG. 3F, a solder paste is printed to cover the exposed surface 41*b*' of each first conductor 41. Thus, the solder bumps 50 are formed. The solder paste is made of, for example, Sn—Ag—Cu-based Pb free solder. The first intermetallic compound 61 is formed at a position where the exposed surface 41*b*' of each first conductor 41 is in contact with the corresponding solder bump 50.

Thus, the circuit module 1 according to the first embodiment can be produced.

In the production method, one or more electronic components 21 and the resin layer 32 may be disposed on the second main surface 11*b* of the substrate 11 by the same method as described in Patent Literature 1.

Next, another embodiment of the circuit module of the present disclosure is described.

The circuit module according to this embodiment is referred to as "the circuit module according to the second embodiment".

Figure 4:
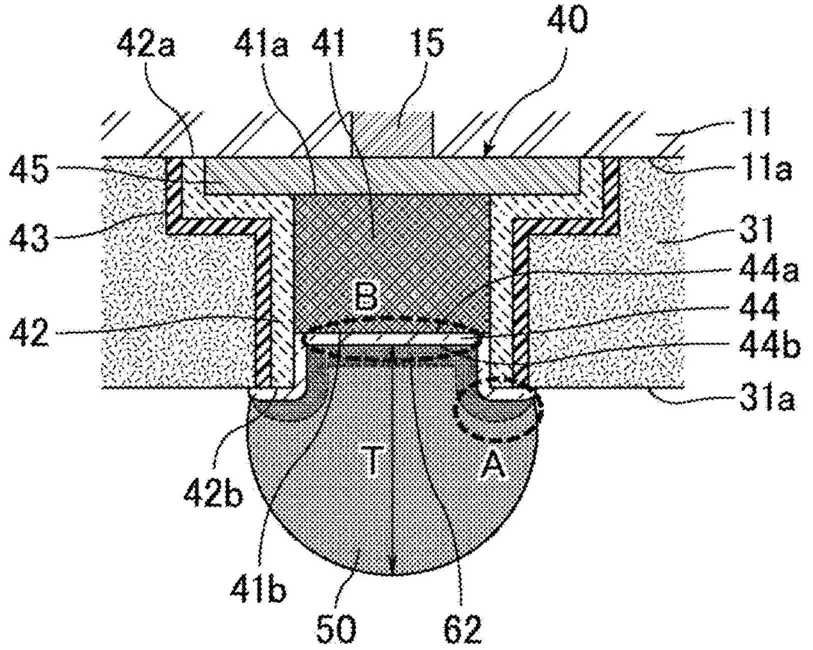
FIG. 4 is a schematic cross-sectional view of an example peripheral structure of a penetrating portion of a circuit module according to a second embodiment of the present disclosure.

FIG. 4 is a schematic cross-sectional view of an example peripheral structure of a penetrating portion of the circuit module according to the second embodiment of the present disclosure.

The circuit module according to the second embodiment includes the same configuration as the circuit module 1 according to the first embodiment, except that a fourth conductor 44 is present in the penetrating portion 40 and that the first conductor 41 is electrically connected to the solder bump 50 via the fourth conductor 44. Detailed descriptions of configurations similar to those of the circuit module 1 according to the first embodiment are omitted.

The circuit module according to the second embodiment includes the fourth conductor 44 in the penetrating portion 40. The fourth conductor 44 is a metal film covering the second bottom 41*b* of the first conductor 41. The first conductor 41 is not in direct contact with the solder bump 50. The first conductor 41 is electrically connected to the solder bump 50 via the fourth conductor 44.

The fourth conductor 44 includes a first surface 44*a* and a second surface 44*b* opposite to each other. The first surface 44*a* of the fourth conductor 44 is closer to the substrate 11 than the second surface 44*b* of the fourth conductor 44 is.

The first surface 44*a* of the fourth conductor 44 is in contact with the second bottom 41*b* of the first conductor 41.

The second surface 44*b* of the fourth conductor 44 is in contact with the solder bump 50 at a position inward of the outer surface 31*a* of the resin layer 31.

A second intermetallic compound 62 is formed on the boundary surface between the solder bump 50 and the second surface 44*b* of the fourth conductor 44 as a result of mutual diffusion of a metal material of the solder bump 50 and a metal material of the fourth conductor 44.

The second intermetallic compound 62 is present inward of the outer surface 31*a* of the resin layer 31.

The second conductor 42 is present between a side surface of the second intermetallic compound 62 and the resin layer 31.

The following effects are produced in cases where a portion of the solder bump 50 is present in the penetrating portion 40 and the second intermetallic compound 62 is present in the penetrating portion 40.

The second intermetallic compound 62 is formed on a boundary surface between the fourth conductor 44 and the solder bump 50. The second intermetallic compound 62 is brittle compared to the fourth conductor 44 and the solder bump 50. The second intermetallic compound 62 formed in the penetrating portion 40 is located inward of the outer surface 31*a* of the resin layer 31. Here, the second conductor 42 is present between the side surface of the second intermetallic compound 62 and the resin layer 31. This alleviates the stress applied to the second intermetallic compound 62 upon impact such as drop. As a result, cracking or breakage of the second intermetallic compound 62 can be prevented or reduced, which improves the impact resistance of the circuit module.

In the circuit module according to the second embodiment, the solder bump 50 is partially present in the penetrating portion 40, which superficially increases the height (the height indicated by a double-headed arrow T in FIG. 4) of the solder bump 50. When the height of the solder bump 50 increases, the stress applied to the solder bump 50 due to temperature cycling is dispersed. This improves the temperature cycling resistance of the circuit module.

Preferably, the fourth conductor 44 covers a portion of the second conductor 42 extending to the same plane with the outer surface 31*a* of the resin layer 31.

With the above configuration, there is a distance in the thickness direction between a portion (A) and a portion (B) of the fourth conductor 44, the portion (A) covering a portion of the second conductor 42 extending to the same plane with the outer surface 31*a* of the resin layer 31, and the portion (B) covering the first conductor 41. Even when the second intermetallic compound 62 is cracked on the portion (A) covering a portion of the second conductor 42 extending to the same plane with the outer surface 31*a* of the resin layer 31, the crack is unlikely to extend to the second intermetallic compound 62 on the portion (B) covering the first conductor 41. This improves the impact resistance of the circuit module.

The second conductor 42 and the fourth conductor 44 may have the same composition.

The material of the fourth conductor 44 may be a metal material selected from, for example, metals such as Ni, Ti, W, and Co and alloys thereof.

When the material of the fourth conductor 44 is Ni, the Ni and the solder form an alloy, resulting in the second intermetallic compound 62, which is a high melting point alloy phase having a high melting point.

Preferably, the thickness of the fourth conductor 44 is 1 μm or more.

Preferably, the second surface 44*b* of the fourth conductor 44 is located inward of the outer surface 31*a* of the resin layer 31 by 1.5 μm or more.

Preferably, the thickness of the second intermetallic compound 62 is 0.5 μm or more.

Preferably, the second conductor 42 is made of a metal material harder than the first conductor 41.

Preferably, the circuit module according to the second embodiment includes the third conductor 43 that is a metal film covering at least a portion of the side surface of the second conductor 42.

The presence of the third conductor 43 further alleviates the stress applied to the second intermetallic compound 62, which improves the impact resistance of the circuit module.

Preferably, the third conductor 43 is made of a metal material having a higher ductility than the second intermetallic compound 62 formed on the boundary surface between the fourth conductor 44 and the solder bump 50. When the third conductor 43 has the above feature, the stress applied to the second intermetallic compound 62 is further alleviated, which further improves the impact resistance of the circuit module.

Next, a method of producing the circuit module according to the second embodiment is described.

FIGS. 5A, 5B, 5C, 5D, 5E, 5F, and 5G are each a schematic cross-sectional view of an example method of producing the penetrating portion of the circuit module according to the second embodiment.

In the method of producing the circuit module according to the second embodiment, the steps not related to the fourth conductors 44 may be similar to those of the method of producing the circuit module 1 according to the first embodiment. As in the circuit module 1 according to the first embodiment, the steps not related to the penetrating portions 40 and the solder bumps 50 may be similar to those of the production method described in Patent Literature 1.

Figure 5A:
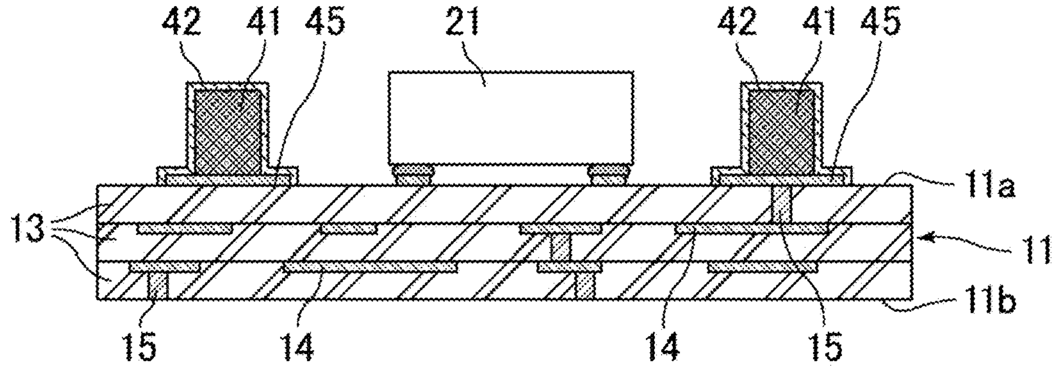
FIG. 5A is a schematic cross-sectional view of an example method of producing the penetrating portion of the circuit module according to the second embodiment.
Figure 5B:
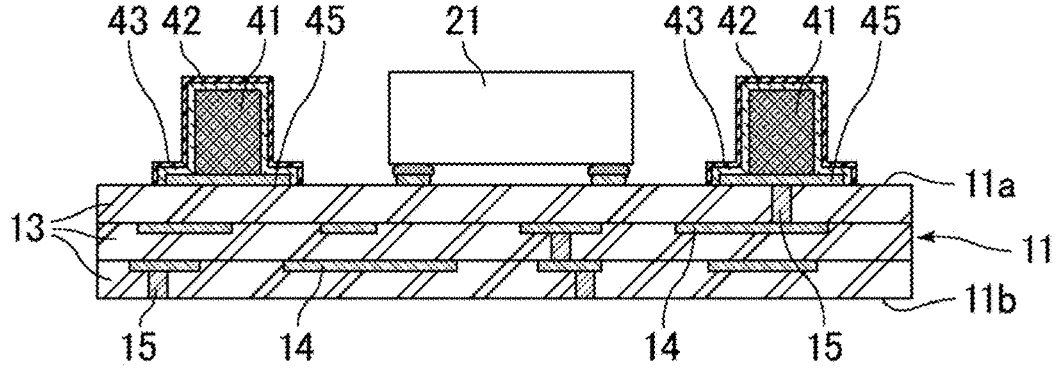
FIG. 5B is a schematic cross-sectional view of an example method of producing the penetrating portion of the circuit module according to the second embodiment.
Figure 5C:
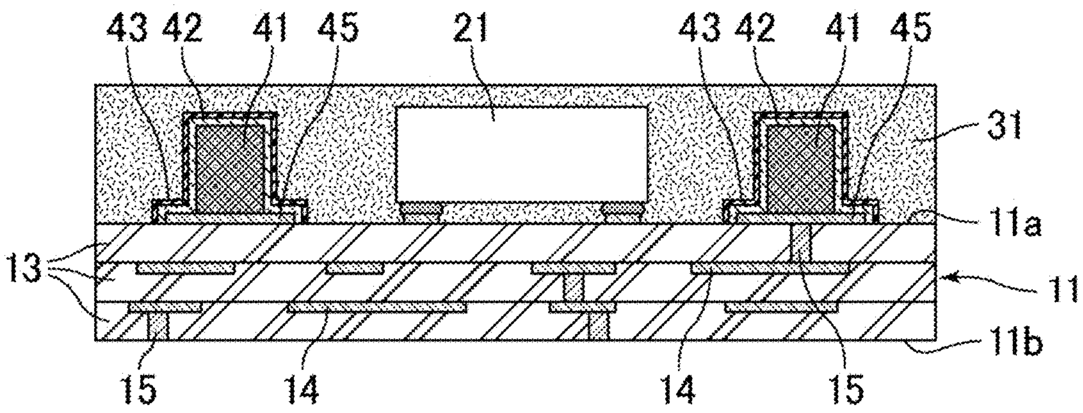
FIG. 5C is a schematic cross-sectional view of an example method of producing the penetrating portion of the circuit module according to the second embodiment.
Figure 5D:
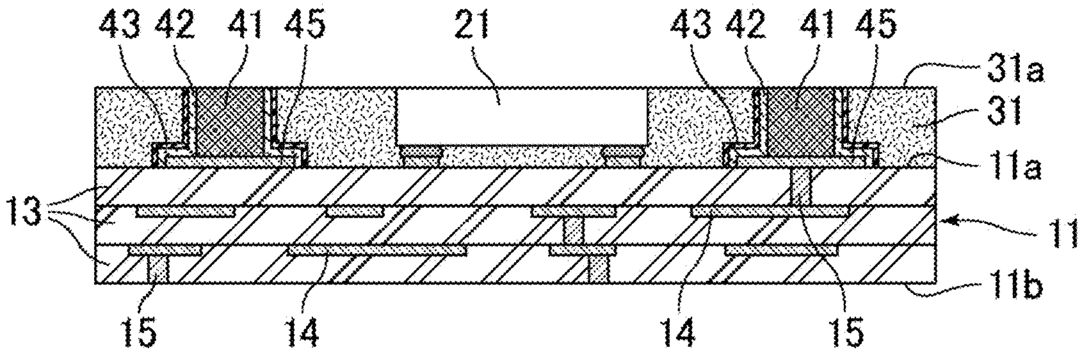
FIG. 5D is a schematic cross-sectional view of an example method of producing the penetrating portion of the circuit module according to the second embodiment.
Figure 5E:
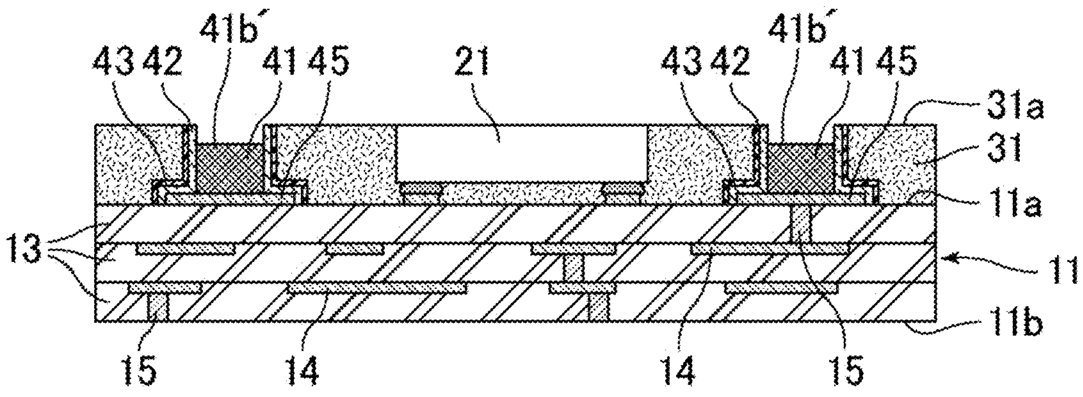
FIG. 5E is a schematic cross-sectional view of an example method of producing the penetrating portion of the circuit module according to the second embodiment.

First, steps similar to those shown in FIG. 3A to FIG. 3E are performed (FIG. 5A to FIG. 5E). The etching depth of the polished surface of each first conductor 41 in FIG. 5E is suitably adjusted such that the second surface 44*b* of each fourth conductor 44 formed in FIG. 5F (described later) is located inward of the outer surface 31*a* of the resin layer 31.

Figure 5F:
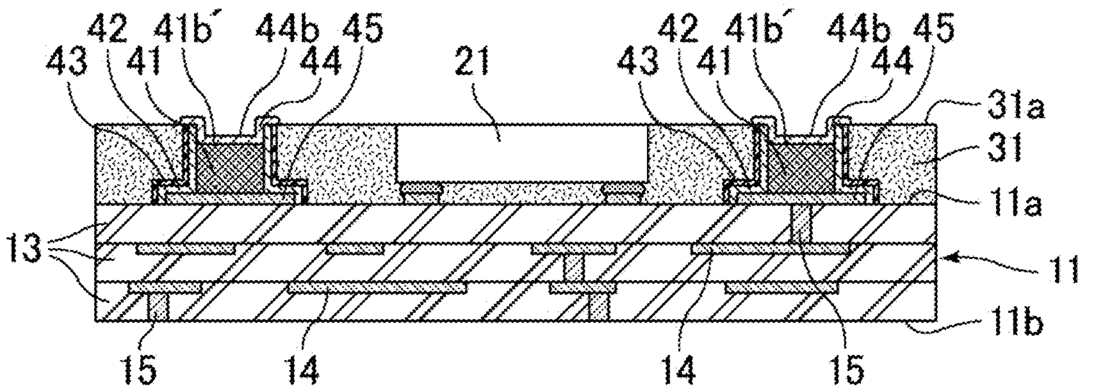
FIG. 5F is a schematic cross-sectional view of an example method of producing the penetrating portion of the circuit module according to the second embodiment.

Next, as shown in FIG. 5F, the fourth conductors 44 are formed to cover the etched exposed surfaces 41*b*' of the first conductors 41. In the step shown in FIG. 5E, the etching depth of the polished surface of each first conductor 41 is adjusted, so that the second surface 44*b* of each fourth conductor 44 formed in this step is located inward of the outer surface 31*a* of the resin layer 31. The fourth conductors 44 can be formed by a known electroless plating method.

Figure 5G:
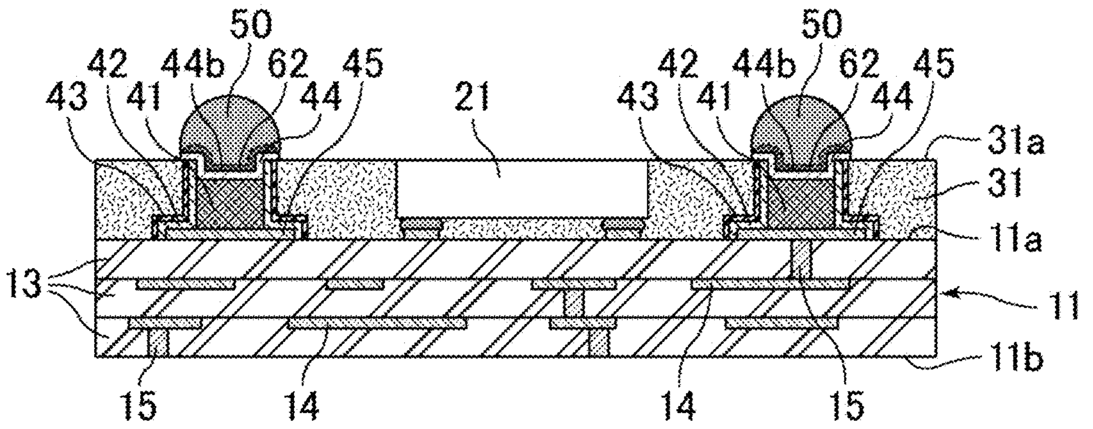
FIG. 5G is a schematic cross-sectional view of an example method of producing the penetrating portion of the circuit module according to the second embodiment.

Next, as shown in FIG. 5G, a solder paste is printed to cover the second surface 44*b* of each fourth conductor 44. Thus, the solder bumps 50 are formed. The solder paste is made of, for example, Sn—Ag—Cu-based Pb free solder. The second intermetallic compound 62 is formed at a position where the second surface 44*b* of each fourth conductor 44 is in contact with the corresponding solder bump 50.

Thus, the circuit module according to the second embodiment can be produced.

In the production method, one or more electronic components 21 and the resin layer 32 may be disposed on the second main surface 11*b* of the substrate 11 by the same method as described in Patent Literature 1.

1 circuit module
11 substrate
11*a* first main surface of substrate
11*b* second main surface of substrate
12 electrode
13 insulation layer
14 pattern conductor
15 via conductor
16 connecting member
21 electronic component
31, 32 resin layer
31*a*, 32*a* outer surface of resin layer
40 penetrating portion
41 first conductor
41*a* first bottom of first conductor
41*b* second bottom of first conductor
41*b*' exposed surface of first conductor
42 second conductor
42*a* first end of second conductor
42*b* second end of second conductor
43 third conductor
44 fourth conductor
44*a* first surface of fourth conductor
44*b* second surface of fourth conductor
45 electrode base
50 solder bump
61 first intermetallic compound
62 second intermetallic compound
63 third intermetallic compound

The invention claimed is:

1. A circuit module comprising:
a substrate including a first main surface and a second main surface;
a resin layer on the first main surface of the substrate;
an electronic component on the first main surface or the second main surface of the substrate;
a penetrating portion penetrating the resin layer in a thickness direction;
a first conductor being a pillar conductor present in the penetrating portion, the first conductor including a first bottom closer to the substrate and a second bottom inward of an outer surface of the resin layer;
a second conductor being a metal film covering at least a portion of a side surface of the first conductor, the second conductor including a portion extending continuously from the side surface of the first conductor to a same plane with the outer surface of the resin layer; and
a solder bump covering an opening of the penetrating portion adjacent to the outer surface of the resin layer, the solder bump including a portion present in the penetrating portion and electrically connected to the second bottom of the first conductor in the penetrating portion,
wherein the portion of the second conductor extending continuously from the side surface of the first conductor covers a side surface of the portion of the solder bump present in the penetrating portion.

2. The circuit module according to claim 1,
wherein the second bottom of the first conductor is in direct contact with the solder bump.

3. The circuit module according to claim 2,
wherein the second conductor comprises a metal material harder than the first conductor.

4. The circuit module according to claim 2, further comprising a third conductor being a metal film covering at least a portion of a side surface of the second conductor.

5. A circuit module comprising:
a substrate including a first main surface and a second main surface;
a resin layer on the first main surface of the substrate;
an electronic component on the first main surface or the second main surface of the substrate;
a penetrating portion penetrating the resin layer in a thickness direction;
a first conductor being a pillar conductor present in the penetrating portion, the first conductor including a first bottom closer to the substrate and a second bottom inward of an outer surface of the resin layer;
a second conductor being a metal film covering at least a portion of a side surface of the first conductor, the second conductor including a portion extending continuously from the side surface of the first conductor to a same plane with the outer surface of the resin layer;
a fourth conductor being a metal film present in the penetrating portion and covering the second bottom of the first conductor; and
a solder bump covering an opening of the penetrating portion adjacent to the outer surface of the resin layer, the solder bump including a portion present in the penetrating portion and electrically connected to the second bottom of the first conductor in the penetrating portion,
wherein a first surface of the fourth conductor is in contact with the second bottom of the first conductor, a second surface opposite to the first surface is in contact with the solder bump at a position inward of the outer surface of the resin layer, and the first conductor is electrically connected to the solder bump via the fourth conductor.

6. The circuit module according to claim 5,
wherein the fourth conductor covers the portion of the second conductor extending to a same plane with the outer surface of the resin layer.

7. The circuit module according to claim 5,
wherein the second conductor and the fourth conductor have a same composition.

8. The circuit module according to claim 5,
wherein the second conductor comprises a metal material harder than the first conductor.

9. The circuit module according to claim 5, further comprising a third conductor being a metal film covering at least a portion of the side surface of the second conductor.

10. The circuit module according to claim 9,
wherein the third conductor comprises a metal material having a higher ductility than a second intermetallic compound provided at a boundary surface between the fourth conductor and the solder bump.

11. The circuit module according to claim 3, further comprising a third conductor being a metal film covering at least a portion of a side surface of the second conductor.

12. The circuit module according to claim 6, wherein the second conductor and the fourth conductor have a same composition.

13. The circuit module according to claim 6, wherein the second conductor comprises a metal material harder than the first conductor.

14. The circuit module according to claim 7, wherein the second conductor comprises a metal material harder than the first conductor.

15. The circuit module according to claim 6, further comprising a third conductor being a metal film covering at least a portion of the side surface of the second conductor.

16. The circuit module according to claim 7, further comprising a third conductor being a metal film covering at least a portion of the side surface of the second conductor.

17. The circuit module according to claim 8, further comprising a third conductor being a metal film covering at least a portion of the side surface of the second conductor.

18. A circuit module comprising:

a substrate including a first main surface and a second main surface;

a resin layer on the first main surface of the substrate;

an electronic component on the first main surface or the second main surface of the substrate;

a penetrating portion penetrating the resin layer in a thickness direction;

a first conductor being a pillar conductor present in the penetrating portion, the first conductor including a first bottom closer to the substrate and a second bottom inward of an outer surface of the resin layer;

a second conductor being a metal film covering at least a portion of a side surface of the first conductor, the second conductor including a portion extending continuously from the side surface of the first conductor to a same plane with the outer surface of the resin layer;

a third conductor being a metal film covering at least a portion of a side surface of the second conductor; and a solder bump covering an opening of the penetrating portion adjacent to the outer surface of the resin layer, the solder bump including a portion present in the penetrating portion and electrically connected to the second bottom of the first conductor in the penetrating portion, wherein the second bottom of the first conductor is in direct contact with the solder bump, and wherein the third conductor comprises a metal material having a higher ductility than a first intermetallic compound provided at a boundary surface between the first conductor and the solder bump.

* * * * *